United States Patent [19]

Janesick

[11] Patent Number: 4,760,031
[45] Date of Patent: Jul. 26, 1988

[54] PRODUCING CCD IMAGING SENSOR WITH FLASHED BACKSIDE METAL FILM

[75] Inventor: James R. Janesick, La Canada, Calif.

[73] Assignee: California Institute of Technology, Pasadena, Calif.

[21] Appl. No.: 835,535

[22] Filed: Mar. 3, 1986

[51] Int. Cl.$^4$ .................... H01L 31/00; H01L 31/14; H01L 31/16

[52] U.S. Cl. .......................... 437/3; 437/53; 437/151; 437/195; 437/203; 437/225; 357/24

[58] Field of Search ................ 29/571, 572, 578, 580, 29/590, 591; 357/24, 30

[56] References Cited

U.S. PATENT DOCUMENTS

| | | | |
|---|---|---|---|
| 3,796,932 | 3/1974 | Amelio et al. | 317/235 R |
| 4,040,092 | 8/1977 | Carnes | 358/213 |
| 4,290,187 | 9/1981 | Stein | 29/571 |
| 4,349,742 | 9/1982 | Ohba et al. | 357/32 |
| 4,477,294 | 10/1984 | Gutierreg et al. | 29/572 |
| 4,536,946 | 8/1985 | Nishigawa et al. | 29/572 |

OTHER PUBLICATIONS

"800×800 Charge–Coupled Device Image Sensor", by M. M. Blouke et al. Optical Engineering, Sep./Oct. 1983, vol. 22, No. 5 pp. 607–614.

"Charge–Couple Device Television Camera for NASA's Galileo Mission to Jupiter", by Kenneth P. Klaasen et al. Optical Engineering May/Jun. 1984, vol. 23, No. 3 pp. 334–342.

"Present and Future CCD's for UV and X-Ray Scientific Measurements", by J. R. Janesick et al; IEEE Trans. on Nuclear Science, vol. NS–32, No. 1 Feb. 1985, pp. 409–416.

"Potential of CCD's for UV and X-Ray Plasma Diagnostics", by J. R. Janesick et al; Rev. Sci Instrum. 56(5) May 1985, pp. 796–801.

Primary Examiner—Brian E. Hearn
Assistant Examiner—Chi-Tso Huang
Attorney, Agent, or Firm—Freilich, Hornbaker, Rosen & Fernandez

[57] ABSTRACT

A backside illuminated CCD imaging sensor for reading out image charges from wells of the array of pixels is significantly improved for blue, UV, far UV and low energy x-ray wavelengths (1–5000Å) by so overthinning the backside as to place the depletion edge at the surface and depositing a thin transparent metal film of about 10Å on a native-quality oxide film of less than about 30Å grown on the thinned backside. The metal is selected to have a higher work function than that of the semiconductor to so bend the energy bands (at the interface of the semiconductor material and the oxide film) as to eliminate wells that would otherwise trap minority carriers. A bias voltage may be applied to extend the frontside depletion edge to the interface of the semiconductor material with the oxide film in the event there is not sufficient thinning. This metal film ("flash gate"), which improves and stabilizes the quantum efficiency of a CCD imaging sensor, will also improve the QE of any p-n junction photodetector.

10 Claims, 16 Drawing Sheets

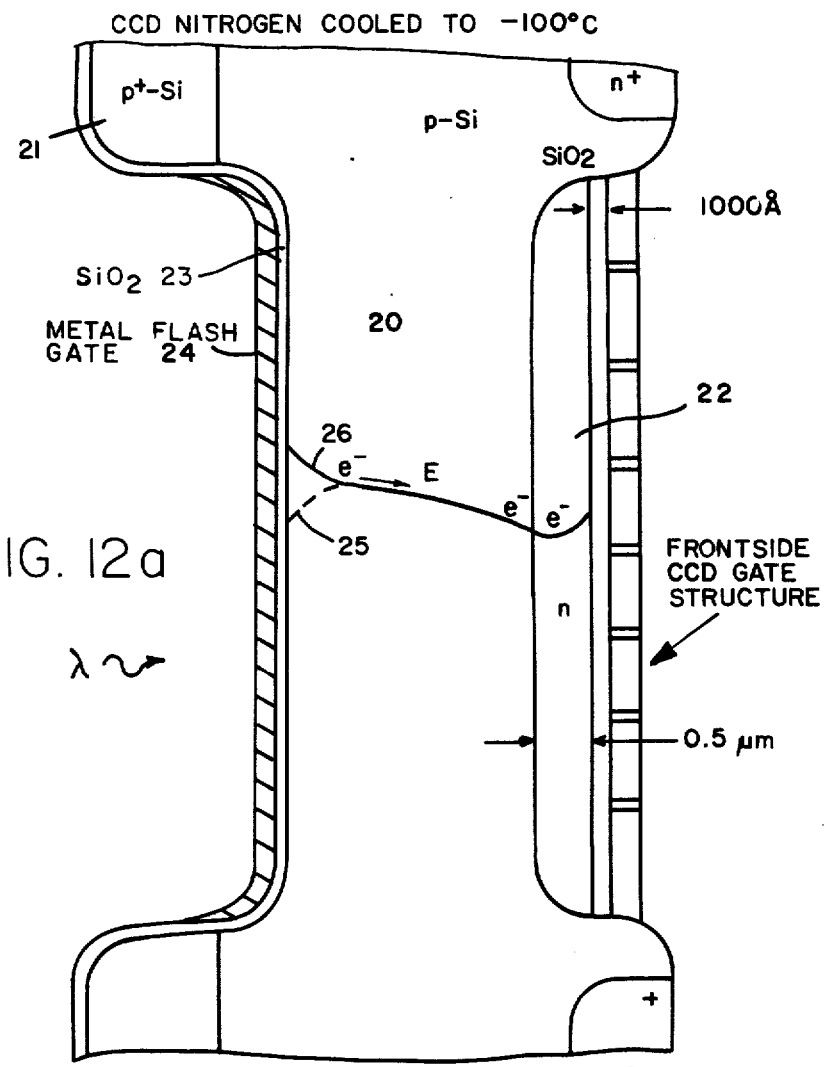
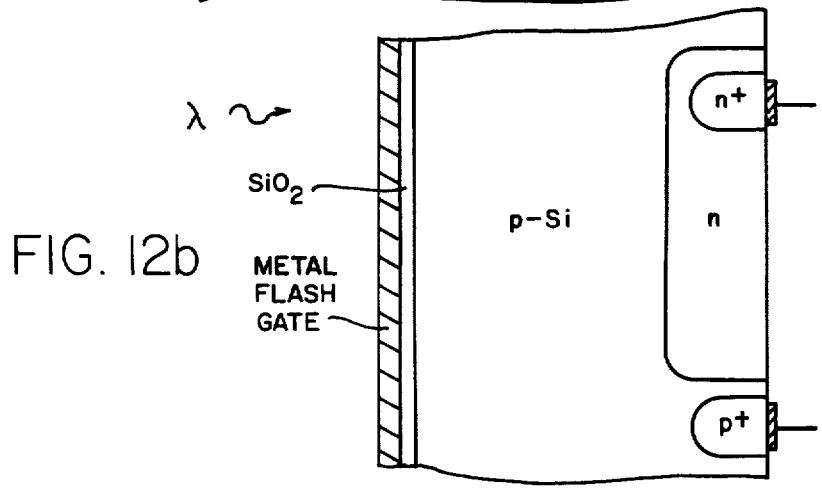
FIG. 12a
FIG. 12b

PRODUCING CCD IMAGING SENSOR WITH FLASHED BACKSIDE METAL FILM

ORIGIN OF INVENTION

The invention described herein was made in the performance of work under a NASA contract, and is subject to the provisions of Public Law 96-517 (35 USC 202) in which the Contractor has elected to retain title.

BACKGROUND OF THE INVENTION

This invention relates to illumination detectors such as charge coupled device (CCD) imaging sensors, or diode sensors, and more particularly to the improvement and stabilization of the quantum efficiency (QE) of such sensors in the near IR, visible UV, XUV and soft x-ray regions of the spectrum.

Charge coupled devices (CCD's) have been chosen for a number of terrestrial and space borne astronomical instruments including the Wide Field/Planetary Camera (WF/PC) used in the Hubble Space Telescope (Lockart, B., SPIE, Vol. 331 (1982)). The eight thinned backside illuminated CCD's used by WF/PC provide high sensitivity in the red, excellent charge transfer efficiency, and low read noise performance. However, the sensors exhibit quantum efficiency hysterisis (QEH) and deliver low sensitivity in the blue and ultraviolet portion of the spectrum (i.e., $\lambda < 4500$ Å). The present inventor has recognized that the surface of the backside illuminated CCD represented two of three parts of a metal-insulator-semiconductor (MIS) device, namely a semiconductor layer and a thin native oxide, but no metal. In a paper titled Backside Charging of the CCD, SPIE, Vol. 570 (1985) by the present inventor, it was shown that such a structure is inherently unstable because of the uncontrolled nature of signal charge in the surface states at the Si–SiO$_2$ interface. To circumvent this problem, the technique of backside charging was developed which attempts to control the surface potential by providing a negative static charge at the backside of the CCD. While this technique is very effective in eliminating QEH, and improving the quantum efficiency (QE) for WF/PC, it is a temporary solution and periodic recharging is necessary whenever the sensors are warmed to ambient temperatures. (The sensors on WF/PC will be kept at a constant temperature of $-95°$ after ultraviolet flooding and charging with the sun so the QE problems are avoided by this backside charging technique.)

It is an object of this invention to present an improved technique which permanently solves the QE and QEH problems for CCD imaging sensors. Recognizing that the CCD backside is simlar to a MIS system, but lacking the metal film, the present inventor has contemplated completing the structure by applying a thin metal film to the backside of the CCD, and directly controlling its surface potential by an external voltage source. Such a structure will allow the user to have complete control of the surface potential and provide the necessary accumulation at the backside to collect 100% of the photogenerated signal carriers within the CCD potential wells located at the frontside. This condition is referred to as the QE-pinned condition (J. Janesick, Backside Charging of the CCD, SPIE, Vol. 570 (1985)). Unfortunately, the lack of a perfect insulating layer with the desired optical properties has prevented the realization of this structure; any leakage current through this insulator will be collected as signal charge at the frontside.

SUMMARY OF THE INVENTION

It has been found that a more intimate contact of a thin backside metal film (hereinafter called a "flash gate"), which is less than 10 Å thick (i.e., only 1 to 3 monolayers) and is essentially transparent at all wavelengths, can, without an external voltage, control the surface potential of the CCD to achieve the desired QE-pinned condition when deposited on a thin native-quality oxide of approximately 30 Å in thickness. The role of this flash gate in controlling the energy band structure of the CCD surface to improve quantum efficiency (QE) will apply equally to photodiode sensors.

The novel features that are considered characteristic of this invention are set forth with particularity in the appended claims. The invention will best be understood from the following description when read in connection with the accompanying drawings.

GENERAL DISCUSSION OF THE STATE OF THE ART

The particular prior-art CCD to be discussed below was the 800×800 Texas Instruments Three Phase CCD (TI 3PCCD) used by WF/PC. This device, along with its ultimate performance limitations, is discussed in considerable detail by J. Janesick, SPIE, Vol. 501 (1984) and M. Blouke and J. Janesick, OPTICAL ENGINEERING, 22(5), 607-614 (1983). The TI 3PCCD structure is built with a 10 Ohm-cm, p-type, 10 μm epitaxial layer on a 0.01 Ohm-cm, p+-type substrate with a 2-4 μm p+-diffusion, and uses a phosphorous implanted n-buried channel. Because of a frontside polysilicon gate, the device is thinned to approximately 10 μm (near the p+/p interface) for backside illumination and is flooded with ultraviolet light from the backside to achieve response throughout the near IR, visible, UV, XUV, and soft x-ray regions (i.e., 1-10,000 Å), as described in U.S. application Ser. No. 642,417 filed Aug. 25, 1984 by James R. Janesick and Stythe T. Elliott.

The thickness of the epitaxial layer, the p+ diffusion and the n-channel have been found to vary considerably from device to device. For example, the p+-diffusion (a diffusion that forms during epitaxial growth and during the CCD fabrication) for some CCDs extends almost completely through the sensor to the n-channel on the frontside. An experimental plot of impurity concentration as a function of thickness through a CCD membrane (frontside including n channel, p-epitaxial layer, and p+-diffusion layer, in that order from front to the substrate in the back) has shown that the p+-diffusion from the backside extends deep into the epitaxial layer on the frontside, reaching within only 2 μm from the n-channel.

The original intent of the p+-diffusion was to stabilize and increase the short wavelength ($\lambda < 5000$ Å) response of the CCD. However, it has been shown that this layer is instead involved with numerous QE problems (J. Janesick, SPIE, Vol. 501 (1984)), including the QEH problem experienced by WF/PC mentioned hereinbefore. In addition, the p+-diffusion has, for the majority of the CCDs tested, significantly limited the full capability offered by backside charging in achieving the QE-pinned condition (J. Janesick, SPIE, Vol. 570 (1985)). (It will also be shown below that the effectiveness of the CCD flash gate of the present invention is also significantly influenced by the presence of the p+ diffusion, which must be eliminated through thinning if the full potential of the prevent invention is to be realized.)

Figure 1:
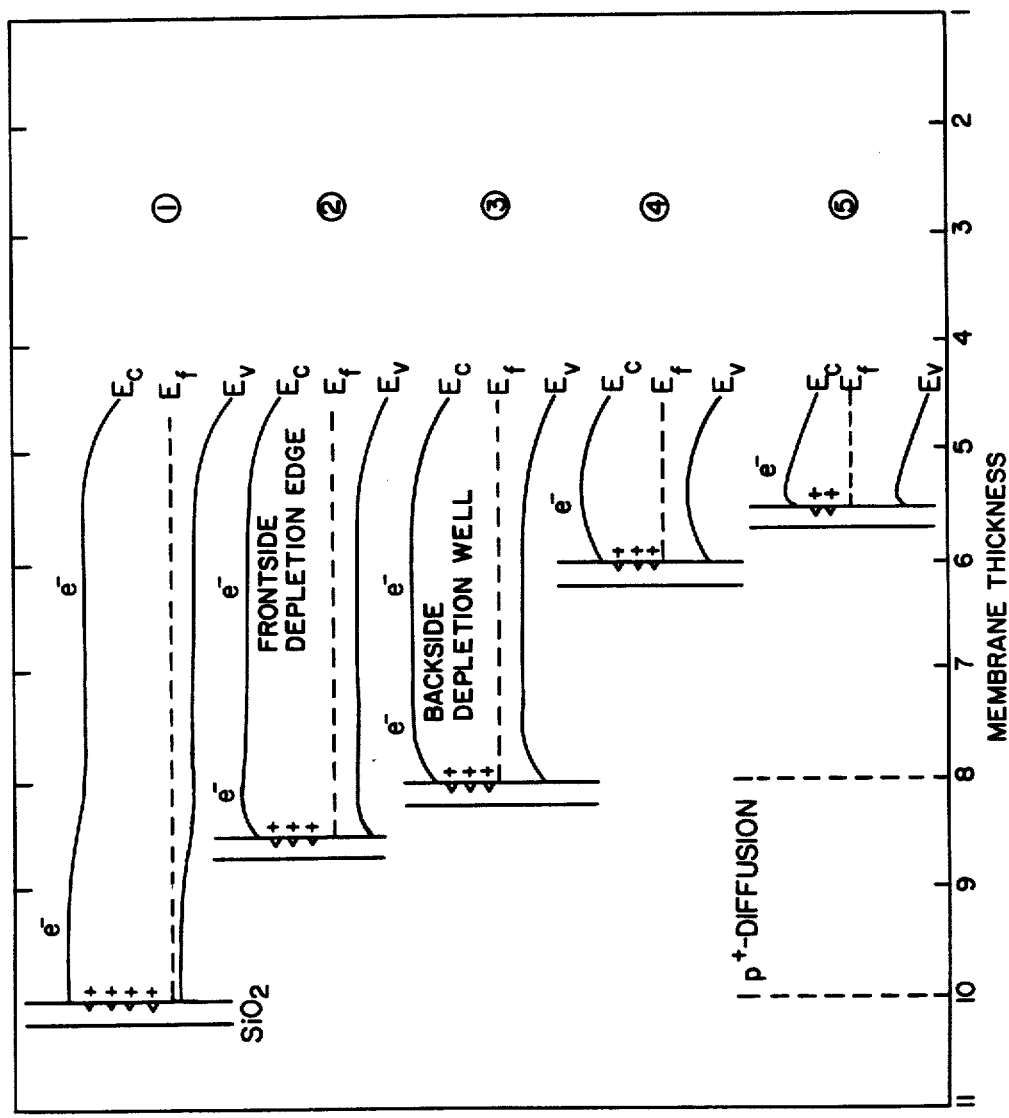
FIG. 1 illustrates energy band structures at the backside of a CCD for the labeled points shown in FIG. 2. Point 5 represents the condition where the frontside depletion edge meets the backside.
Figure 2:
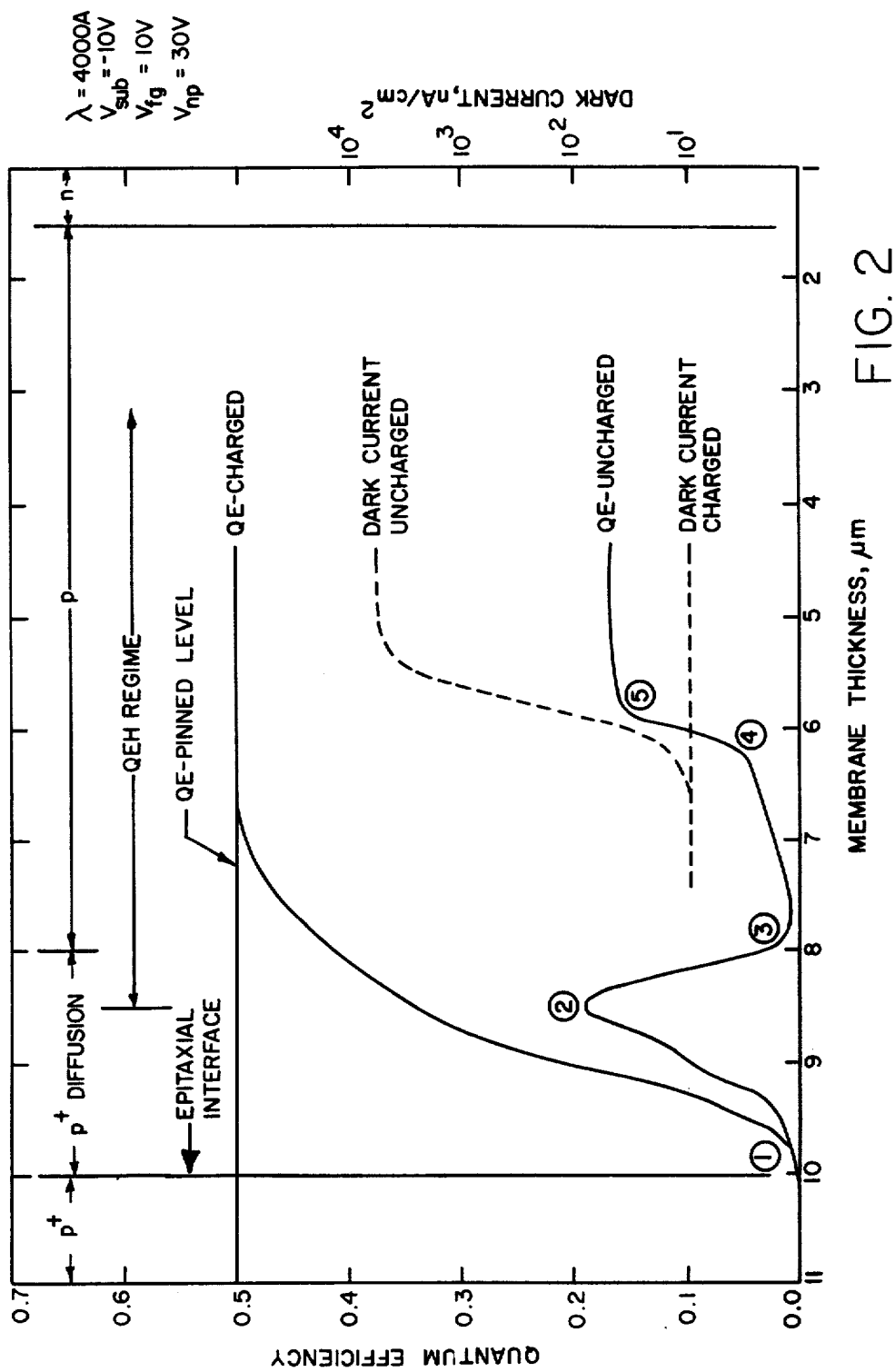
FIG. 2 is a graph of quantum efficiency and dark current as a function of membrane thickness for a CCD channel shown in FIG. 3 under backside charged and uncharged conditions. Note that the QE-pinned condition can be achieved with backside charging when most of the p+-diffusion is removed by thinning.

The thinning technique employed on the TI 3PCCD often gave rise to variations in membrane thickness on a single device large enough to allow the QE to be studied as a function of thickness from the substrate into the epitaxial layer. (The term "membrane" refers to the thinned semiconductor body under the diffused n-channel of the CCD.) The QE and dark current (for uncharged and charged conditions) as a function of membrane thickness was in part discussed in considerable detail by J. Janesick, SPIE Vol. 570 (1985). Corresponding energy band diagrams are drawn in FIG. 1 for the five labeled regions at points 1-5 shown in FIG. 2. Note that the diagram of FIG. 2 is a function of membrane thickness including the n-channel. Only the device physics between points 4 and 5 will be discussed below because it is in this region where the flash gate (and backside charging) yields the optimum in QE performance. Note that this region is deep in the membrane.

Backside Depletion

The increase in sensitivity between points 4 and 5 is attributed to the frontside depletion edge (shown in the diagram of FIG. 3) reaching the backside of the CCD. As the depletion edge is caused to be closer to the backside through thinning the back, the Fermi level relative to the valence band increases, as shown in FIG. 1 at the various points labeled 1 through 5 to correspond to points indicated in FIG. 2. As that thickness decreases and the Fermi level rises, the positive interface states located at the backside Si-SiO₂ interface are in effect neutralized by electron trapping, which in turn causes the backside well to decrease, thereby increasing the QE as shown in FIG. 2. This sequence of events at the backside occurs rapidly over a small change in membrane thickness (approximately over 1 Debye length ≈700Å for the TI 3PCCD). For convenience the scale of FIG. 2 is shown in FIG. 1. A thinned membrane of between 5 and 6 μm is thus shown to be adequate, although thinning to between 3 and 4 μm is possible.

It should be mentioned that electron trapping can also take place when photogenerated electrons are supplied near the backside under cold operation (the manifestation of QEH). It has been experimentally shown that the blue QE significantly increases when signal electrons are trapped at the backside Si-SiO₂ interface as the positive interface states are neutralized reducing the size of the backside well. Under the conditions where the size of the backside well is minimized (again either through moving the frontside depletion edge to the backside or trapped photogenerated charge), that backside charging is considerably more effective for only a small amount of negative static charge is necessary at the CCD surface to pull the energy bands into the accumulated state. As will be shown below, the flash gate of the present invention is also more effective under these same conditions, and in addition is permanent.

Note from FIG. 2 that the backside dark current also sharply rises between points 4 and 5. As the Fermi level rises, it is easier for electrons to "hop" from the raised Fermi level to the conduction band through interface states. Also, since the backside well is significantly smaller, electrons at the backside can diffuse from this well to the frontside potential wells where they are collected and transferred out as signal carriers.

Depletion Edge Control

It will be further shown below that the performance of the CCD flash gate of the present invention is highly dependent on Fermi position at the backside. The flash gate will achieve maximum accumulation (i.e., maximum QE) when the Fermi level is at its highest level or when the backside is fully depleted. Because depletion control is an integral part of the flash gate concept, it will be shown how the frontside depletion edge can be moved to the backside, not just by thinning, but through external voltages applied to the CCD.

Figure 3:
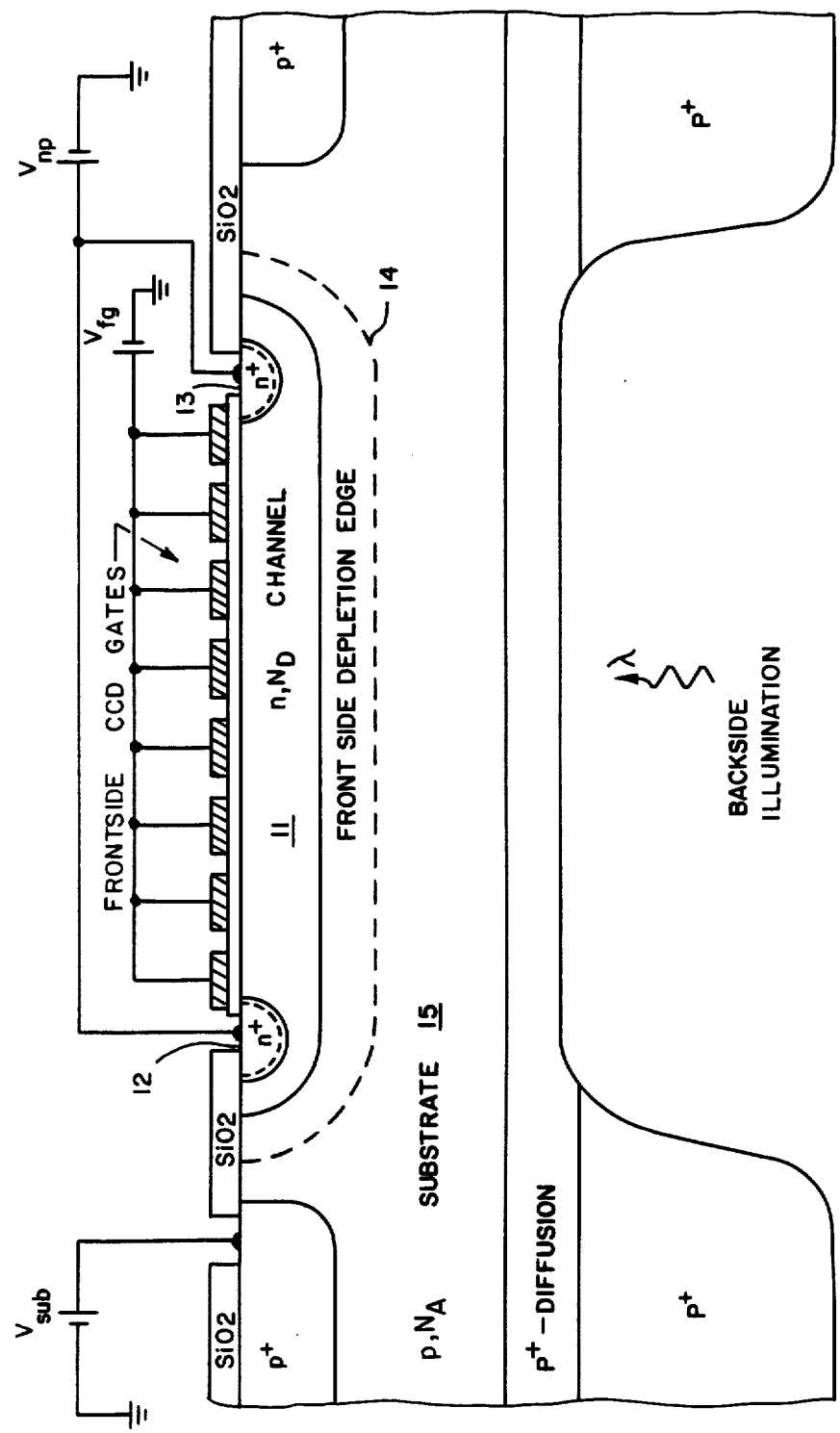
FIG. 3 illustrates a cross section of a CCD channel showing the n+ input and output diodes, frontside depletion edge, and three external voltages that control the frontside depletion edge.

FIG. 3 shows a simplified cross section of the prior-art CCD (TI 3PCCD) perpendicular to the frontside and parallel to a CCD signal channel. An n-buried channel 11 in an epitaxial layer 15 has n⁺ contacts 12 and 13 at both ends which form the input and output diodes, respectively. The frontside depletion edge (shown by a dotted line 14) is dependent on three bias voltages shown:

(i) $V_{np}$ = the frontside depletion voltage;
(ii) $V_{fg}$ = the frontside gate voltage; and
(iii) $V_{sub}$ = the substrate voltage.

Figure 4:
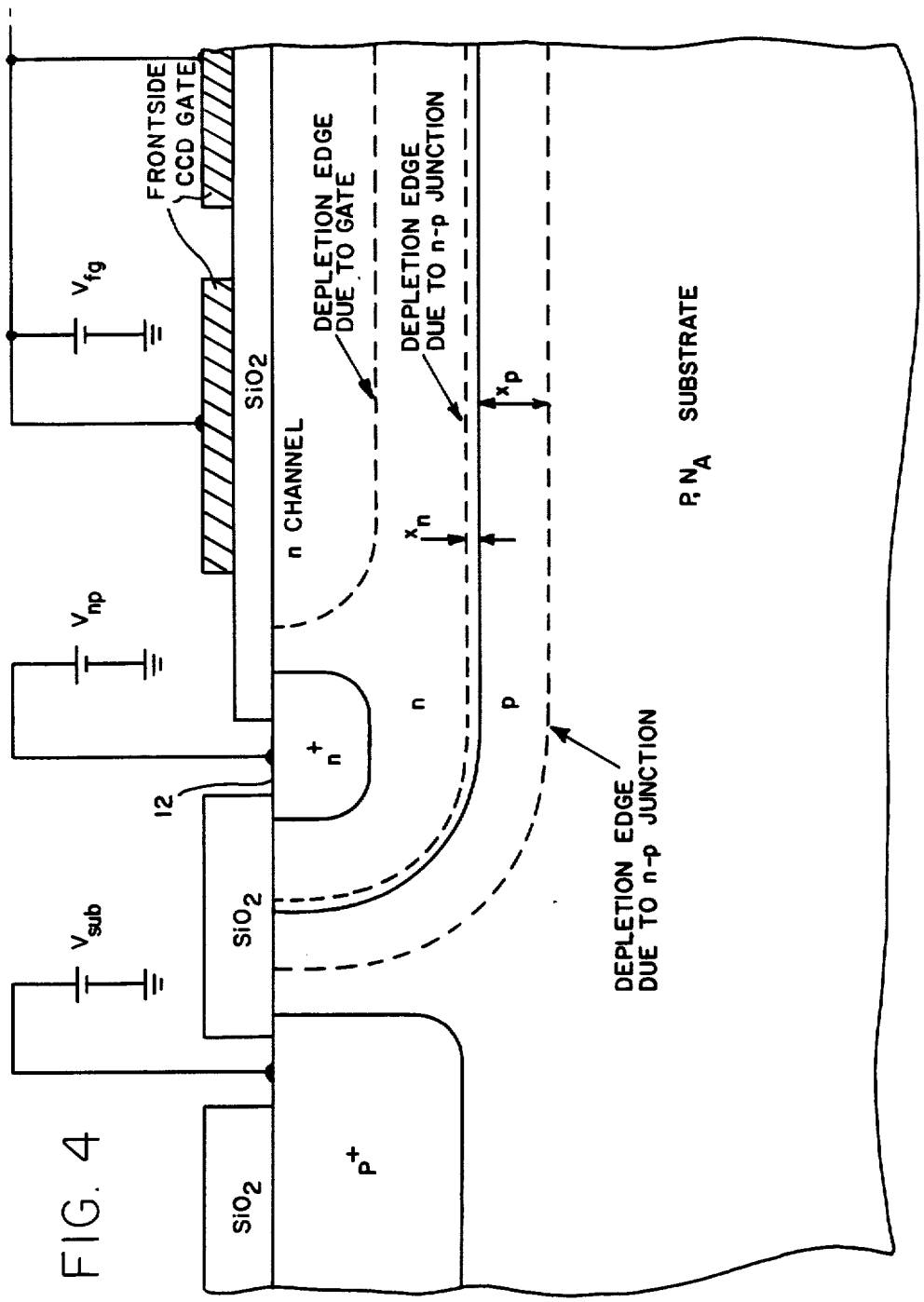
FIG. 4 is an enlarged view of a portion of the CCD channel of FIG. 2 showing the depletion regions near the n-p junction ($x_n$ and $x_p$) beneath the frontside gate before the n channel is fully depleted.

The constraint on the voltage applied to the input and output diodes, $V_{np}$, is that it must be sufficiently large to completely deplete the n-buried channel of majority carriers (electrons) under the normal bias conditions applied through $V_{fg}$ and $V_{sub}$. For the TI 3PCCD this voltage is approximately 30V. FIG. 4 depicts pictorally the various voltages and the conditions before the n-channel depletes completely. For a fixed $V_{sub}$ and $V_{fg}$ (e.g., zero volts) a change in $V_{np}$ causes a depletion region to form on both sides of the n-p junction. The depletion region, $x_n$, above the junction changes only slightly with $V_{np}$ due to the high doping of the n-channel and varies in accordance with the equation:

$$x_n = \left[ \frac{2\epsilon_S N_A}{qN_D(N_A + N_D)} (V_{bi} + |V_{np}|) \right]^{\frac{1}{2}} \quad (1)$$

where $V_{bi}$ is the built in voltage (0.6V), $\epsilon_S$ is the permittivity of silicon (1.044×10⁻¹² F/cm), of is the electronic charge (1.6×10⁻¹⁹ coulombs), $N_D$ is the n-impurity concentration within the n-channel and $N_A$ is the p-impurity concentration of the epitaxial layer 15.

Figure 5:
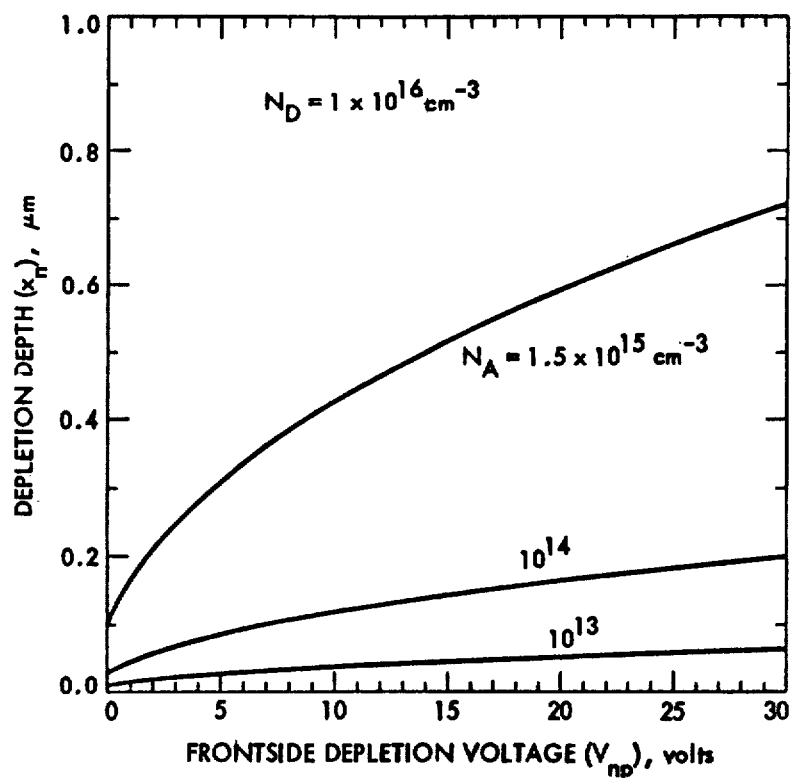
FIG. 5 is a graph of the depletion region, $x_n$, as a function of $V_{np}$ for different epitaxial impurity concentrations. Note that less than a micron of movement in $x_n$ occurs for a 30V change in $V_{np}$.

FIG. 5 plots $x_n$ as a function of $V_{np}$ for different epitaxial layer resistivities. In case of TI 3PCCD ($N_D$=1×10¹⁶cm⁻³, $N_A$=1.5×10¹⁵cm⁻³), $x_n$ varies by less than 1 μm over a 30V change in $V_{np}$.

In addition to the depletion around the n-p junction, a depletion region also develops from the gate side as the voltage between the gate and n-channel increases with $V_{np}$. Here that depletion forms much more rapidly for a given change in $V_{np}$ compared to $x_n$ and is the main source in depleting the n-channel. At some voltage, $V_{np}$ will be sufficiently large to cause the two depletion edges to meet and full depletion of the channel is achieved (this is approximately 12V for the TI 3PCCD with $V_{fg}$=0V, $V_{sub}$=0V). Under these conditions, $V_{np}$ loses all control of the frontside depletion edge, $x_p$, because any change in $V_{np}$ only effects depletion near the input and output diodes within the n⁺ and surrounding p-regions. When the n-channel is fully depleted, control of the frontside depletion edge comes totally through $V_{sub}$ and $V_{fg}$.

Figure 6:
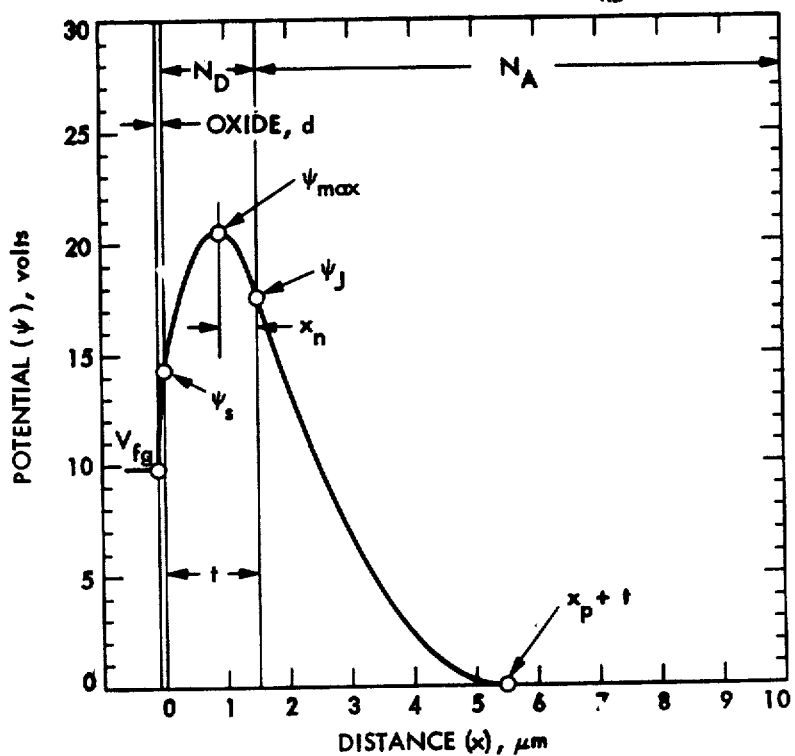
FIG. 6 is a graph of potential distribution $\psi$ through the CCD of FIGS. 3 and 4 as a function of distance from the frontside, where the symbols are as used in equations developed in the specification.

For a fully depleted channel, the potential distribution and the depth of the frontside depletion edge within the CCD can be analytically found if an idealized doping distribution is assumed for the buried channel layer. One such doping is the "box distribution," where the impurity concentration is constant throughout the n-layer. Using the symbols defined in FIG. 6, the potential within the CCD can be found by satisfying the Poisson's equations: with the boundary conditions:

$$\frac{d^2\psi}{dx^2} = 0 \qquad -d < x < 0 \quad (2)$$

$$\frac{d^2\psi}{dx^2} = -\frac{qN_D}{\epsilon_S} \quad 0 < x < t \quad (3)$$

$$\frac{d^2\psi}{dx^2} = \frac{qN_A}{\epsilon_S} \quad t < x < t + x_p \quad (4)$$

with the boundary conditions:

$$\psi(x = -d) = V_{fg} \quad (5)$$

$$\epsilon_{ox} \frac{d\psi}{dx}\bigg|_{x=0} = \epsilon_S \frac{d\psi}{dx}\bigg|_{x=0} \quad (6)$$

$$\psi(x = 0^-) = \psi(x = 0^+) \quad (7)$$

$$\frac{d\psi}{dx}\bigg|_{x=t^-} = \frac{d\psi}{dx}\bigg|_{x=t^+} \quad (8)$$

$$\psi(x = t^-) = \psi(x = t^+) \quad (9)$$

-continued $$\psi(x = t + x_p) = 0 \quad (10)$$

The potential $\psi$ (as a function of x) throughout the CCD can be found by solving Equations (2), (3), and (4) yielding:

$$\psi_1 = V_{fg} - E_{ox}(x + d) \quad -d < x < 0 \quad (11)$$

$$\psi_2 = \psi_{max} - \frac{qN_D}{2\epsilon_S}(x - x_n)^2 \quad 0 < x < t \quad (12)$$

$$\psi_3 = \frac{qN_A}{2\epsilon_S}(x - t - x_p)^2 \quad t < x < t + x_p \quad (13)$$

where:

$$E_{ox} = \frac{qN_D x_n}{\epsilon_{ox}} \quad (14)$$

$$\psi_{max} = \psi_J\left(1 + \frac{N_A}{N_D}\right) \quad (15)$$

$$\psi_J = \frac{2(V_{fg} + V_{imp}) + V_{ox} - \{V_{ox}[V_{ox} + 4(V_{fg} + V_{imp})]\}^{\frac{1}{2}}}{2} \quad (16)$$

$$V_{imp} = \frac{qN_D t^2}{2\epsilon_S}\left(1 + \frac{2\epsilon_S d}{\epsilon_{ox} t}\right) \quad (17)$$

$$V_{ox} = \frac{2qN_A t^2}{\epsilon_S}\left(1 + \frac{\epsilon_S d}{\epsilon_{ox} t}\right)^2 \quad (18)$$

$$x_n = t - \frac{N_A}{N_D} x_p \quad (19)$$

$$x_p = \left(\frac{2\epsilon_S \psi_J}{qN_A}\right)^{\frac{1}{2}} \quad (20)$$

where $\epsilon_{ox}$ is the permittivity of the oxide ($3.45 \times 10^{-13}$ F/cm), d is the oxide thickness (cm), t is the n-channel thickness (cm), $x_p$ is the frontside depletion depth in the p-region (cm), $\psi_{max}$ is the maximum potential (V) within the channel, $x_n$ is the position of $\psi_{max}$ from the n-p junction interface (cm), $\psi_J$ is the potential (V) at the metallurgical junction, $\psi_{imp}$ is the voltage required by $V_{np}$ to completely deplete the n-channel, and $E_{ox}$ is the electric field (V/cm) across the oxide.

When the flat band voltage $V_{FB}$ is included, the gate voltage, $V_{fg}$, must be modified:

$$V_{fg} = V_{fg} - V_{FB} \quad (21)$$

$$V_{FB} = \phi_{ms} - \frac{Q_{ss}d}{\epsilon_{ox}} \quad (22)$$

where $\phi_{ms}$ is the gate-semiconductor work function difference (V) and $Q_{ss}$ is the fixed positive charge density (Coulombs/cm$^2$) within the oxide. Typical values for $V_{FB}$ are $-1$ to $-2$ V, but for convenience, all results presented below will assume it to be zero. The effect of $V_{FB}$ is to increase the gate voltage by $-V_{FB}$.

Figure 7:
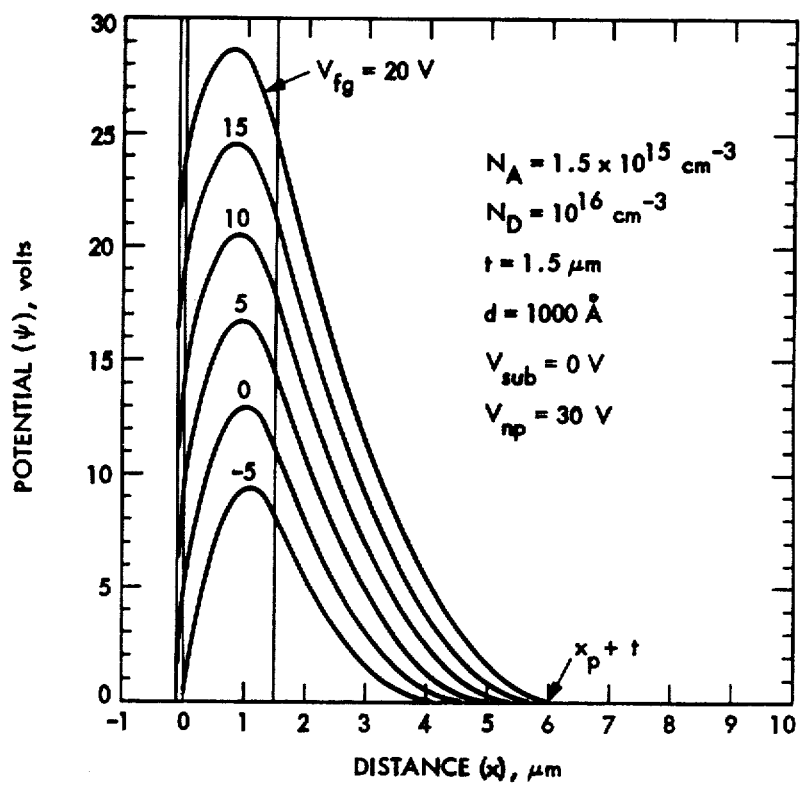
FIG. 7 is a graph of potential distribution as a function of distance for different $V_{fg}$ leaving $V_{sub}$ and $V_{np}$ fixed. Note that the depletion depth, $x_p+t$, increases slowly with increasing $V_{fg}$.

Using the equations above, FIG. 7 plots the potential distribution within the CCD channel as a function of distance for various $V_{fg}$. The doping parameters and the thicknesses of the n-channel (1.5 μm) and the oxide (1000 Å) shown in FIG. 7 best represent that of the TI 3PCCD. It can be seen that the total depletion depth, $(x_p+t)$, increases with increasing $V_{fg}$. For example, a gate voltage of 20 V creates a depletion depth of 6.0 μm from the frontside surface.

The depletion depth, $x_p$, in the p-region as a function of $V_{np}$ is given by:

$$x_p = \left[\frac{2\epsilon_S N_D}{qN_A(N_A + N_D)}(V_{bi} + |V_{np}|)\right]^{\frac{1}{2}} \quad (23)$$

Figure 8:
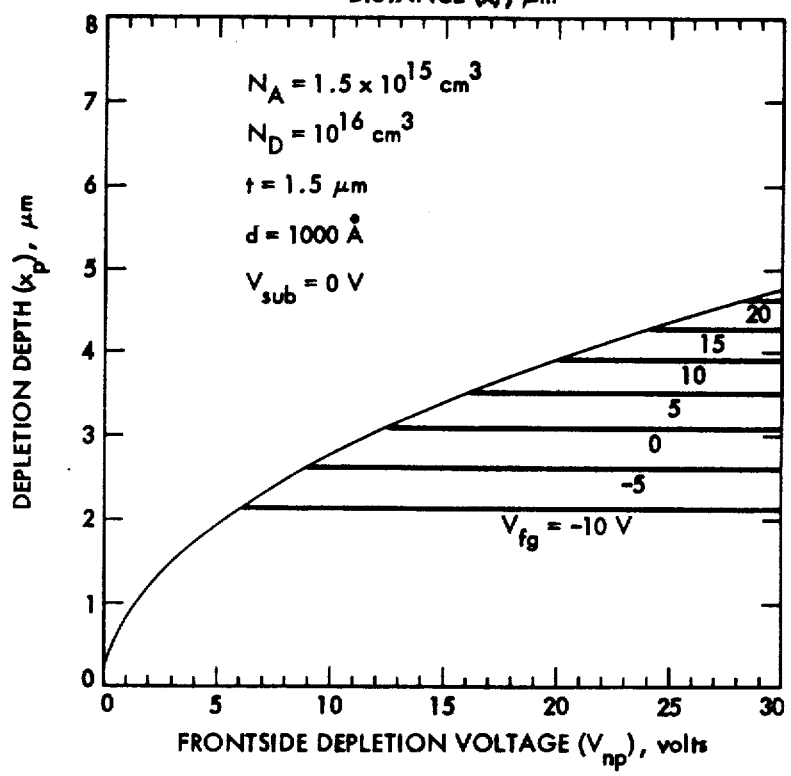
FIG. 8 is a graph of depletion depth, $x_p$, as a function of $V_{np}$ for different $V_{fg}$. Horizontal lines indicate where $V_{np}$ loses control over the frontside depletion depth for a fixed $V_{fg}$ and $V_{sub}$.

A plot of depletion depth, $x_p$, as a function of frontside depletion voltage, $V_{np}$, is shown in FIG. 8 with frontside gate voltage, $V_{fg}$, as a parameter, showing the depletion depths when $V_{np}$ loses control. The envelope of this plot represents the condition of maximum depletion given by Equation (23). For example, when one sets $V_{np}=30$ V, a maximum depletion depth, $x_p$, of about 4.8 μm is obtainable for $V_{fg}=20$ V.

Substrate Depletion Edge Control

Since the frontside gate voltage, $V_{fg}$, is referenced to the potential of the substrate, the depletion distance, $x_p$, can also be adjusted through the substrate voltage $V_{sub}$. In other words, if the substrate voltage is increased by 1 V, the depletion edge will shrink by the same amount when the gate voltage is lowered by 1 V. Since varying the substrate voltage is more convenient and less stressful to the CCD, it is preferable to change the depletion edge through $V_{sub}$ and leave the gate voltage fixed. Typically all phases are set to approximately +10 V during signal integration.

Figure 9:
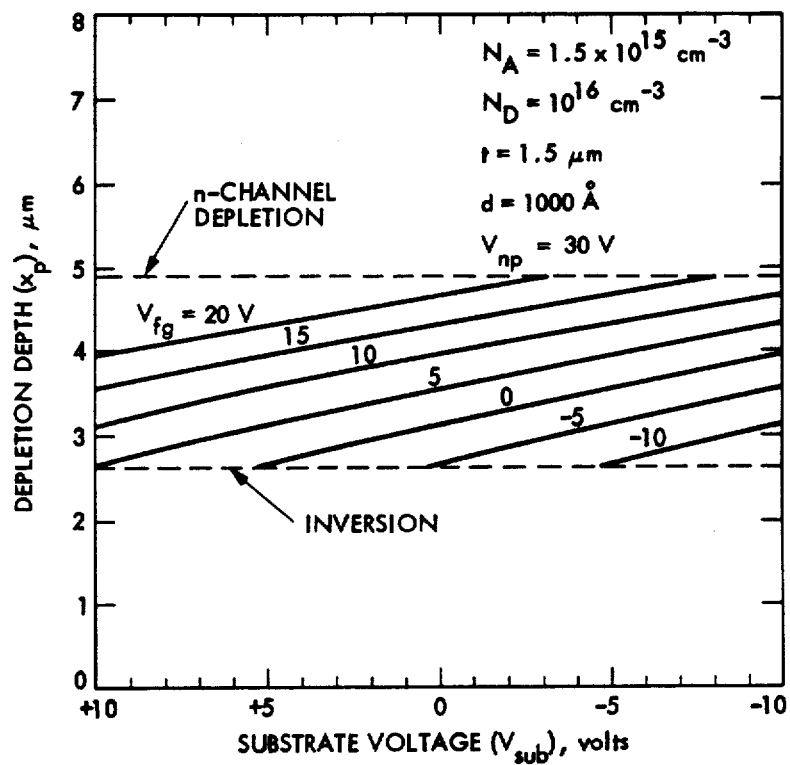
FIG. 9 is a graph of depletion depth, $x_p$, as a function of $V_{sub}$ for different $V_{fg}$. The region shown between horizontal lines is where the frontside depletion edge is controlled by $V_{fg}$ and $V_{sub}$.

FIG. 9 plots depletion depth, $x_p$, as a function of substrate voltage, $V_{sub}$, for various levels of frontside gate voltage, $V_{fg}$, leaving the frontside depletion voltage, $V_{np}$, fixed at 30 V. Note that a positive change in $V_{sub}$ causes a decrease in depletion depth while a negative change causes an increase in depletion depth. For the TI 3PCCD the depletion depth changes less then 2 μm over a 20 V range of $V_{sub}$ for $V_{fg}=10$ V. The depletion depth is also bounded by the two horizontal lines shown in FIG. 9. The lower line indicates the bias conditions that promotes inversion of holes within the n-channel. In other words, when the surface potential, $\psi_s$, at the Si-SiO$_2$ interface is less than the substrate potential, holes from the channel-stops (which are connected to the substrate) migrate beneath the gate region. Under these conditions, $V_{fg}$ and $V_{sub}$ lose control of the frontside depletion edge. For example, $V_{sub}=0V$, and $V_{fg}=-5$ V promotes the onset of channel inversion. This is also observed in FIG. 7, where $\psi_s=0V$ when $V_{fg}=-5$ V. For the TI 3PCCD, that channel inversion typically occurs at $V_{fg}=-7$ V. The top horizontal line shown in FIG. 9 indicates that point where the CCD n-channel is fully depleted; any bias condition above this line indicates that the channel is not depleted fully.

Figure 10:
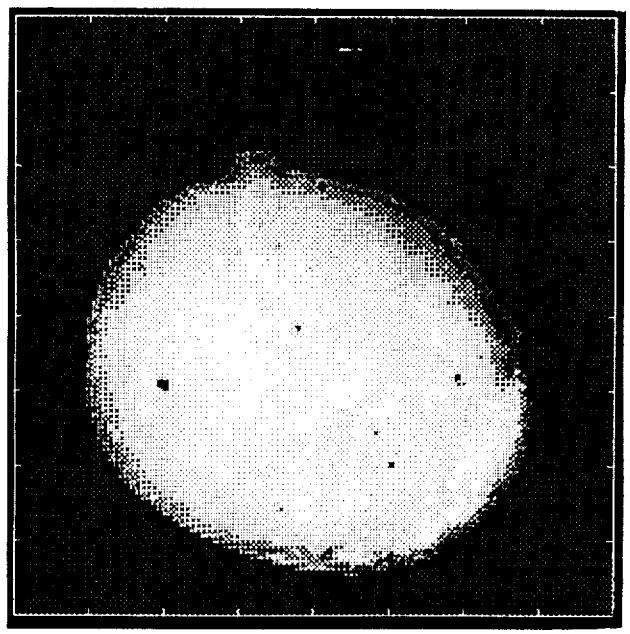
FIG. 10 is a photograph of a CRT display of a 4000 Å A flat-field image by a CCD "spot-thinned" into the frontside depletion edge. Note the increase in QE in the thinned area due to an increase in the Fermi level at the backside throughout the thinned area.
Figure 11:
FIG. 11 is a photograph of a CRT display produced in a manner similar to the display of FIG. 10, except that a substrate voltage was increased to cause the depletion edge to move away from the backside, causing the QE to be decreased in the spot-thinned area.

FIGS. 10 and 11 experimentally demonstrate that the QE increases when the frontside depletion edge moves away from the backside by an increase in $V_{sub}$. FIG. 10 is a photograph of a CRT display of a 4000 Å flat field image from a CCD showing a small nearly round region (200×200 pixel diameter) on the CCD which was purposely "spot-thinned" into the frontside depletion edge ($V_{fg}=10$ V, $V_{sub}=0$, $V_{np}=30$ V) showing an increase in QE due to an increase in the Fermi level at the backside. The thinned region is a factor of 5 higher in sensitivity than the surrounding area and represents where the frontside depletion area meets the back surface. The CRT displayed image shown in FIG. 11 was produced in a similar manner except that the substrate voltage was increased to +10 V which moves the depletion edge away from the backside, causing the QE to drop sharply due to the formation of a larger backside well. In both of these figures, the images are shown as displayed on a cathode ray tube using only every seventh pixel in each row, each pixel being displayed with intensity (brightness) as a function of sensitivity. Thus, by increasing the substrate voltage, the sensitivity of the thinned region on the CCD becomes less than even the unthinned surrounding area.

DESCRIPTION OF PREFERRED EMBODIMENTS

CCD Flash Gate

Figure 12:
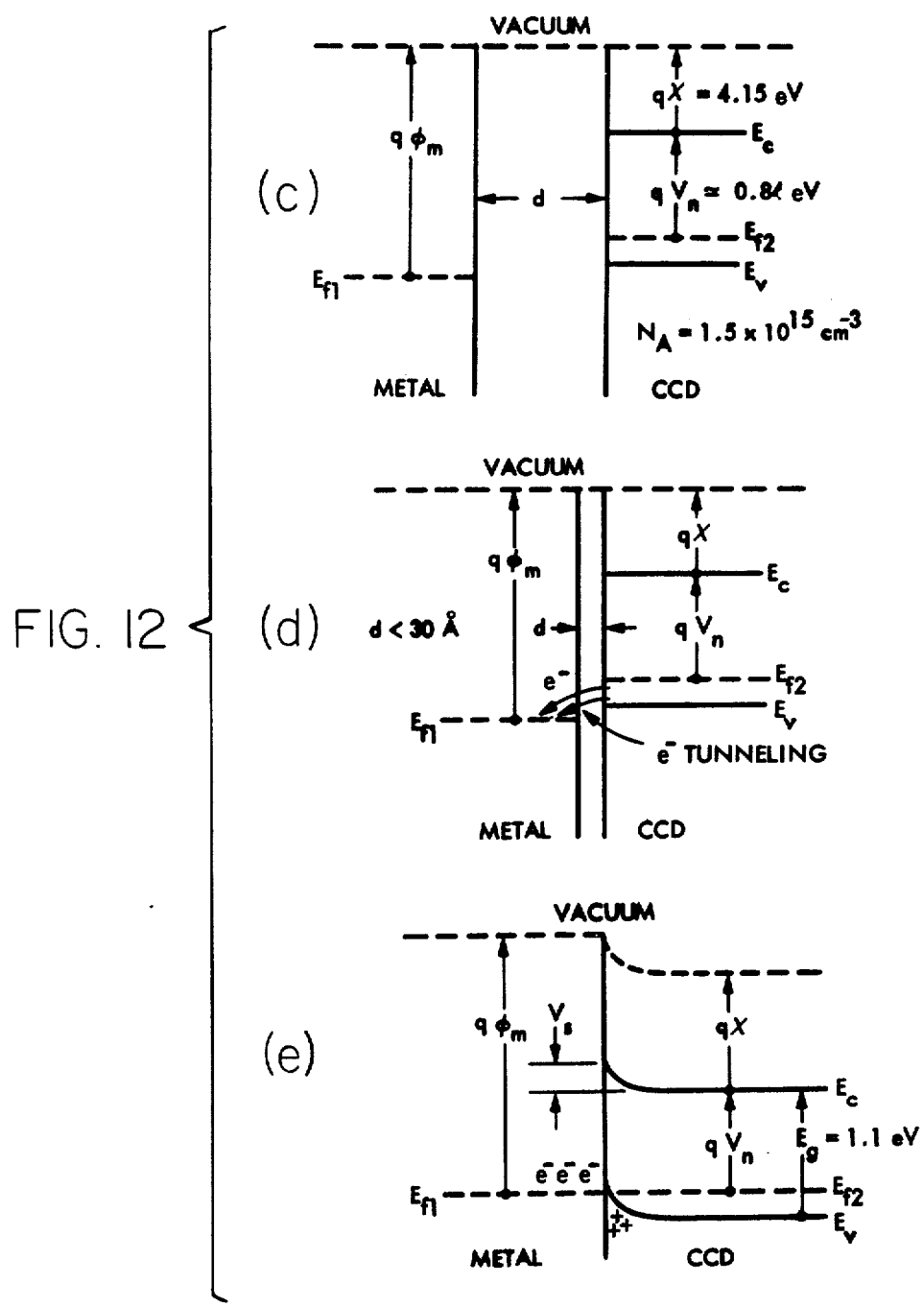
FIG. 12a is a cross section of a silicon CCD similar to that of FIGS. 2 and 3, except that, in accordance with the present invention, a metal flash gate is deposited over a native oxide film after overthinning, FIG. 12b in a cross section for a diode photodetector using a metal flashed gate, and FIGS. 12c, d and e illustrate successive stages in the establishment of equilibrium between the CCD and metal for an ideal flash gate. A contact voltage, $V_s$, develops as electrons tunnel from the CCD onto the metal gate which has a higher work function than the semiconductor material of the CCD.

The theory behind the present invention which is comprised of a CCD flash gate will now be described. When a metal with a high work function makes intimate contact with the backside of the CCD, a contact potential develops which can promote strong accumulation and possibly achieve the QE-pinned condition. FIG. 12a is a cross section of a CCD very similar to the prior-art CCD shown in FIG. 3 of this application (and FIG. 6 of the aforesaid patent application) comprised of a p-doped Si layer 20 epitaxially grown over p+ substrate 21 and a diffused n channel 22 over which a CCD gate structure is fabricated to complete the frontside. The backside, which is to be illuminated, is overthinned to produce a membrane under the n-channel. Additional detail of this CCD is the same as shown in FIGS. 3 and 4. The primary difference is that over a native $SiO_2$ film 23 on the thinned backside area there is deposited as a flash gate a metal film 24 sufficiently thin (few monolayers) to be transparent. The normal potential decreases near the interface of the backside semiconductor 20 and the oxide film 23 in the thinned area, as shown by a dashed line 25. As a consequence, photogenerated electrons may be trapped near that interface. Upon flashing a thin film of metal over the native $SiO_2$, the potential is increased near the $Si-SiO_2$ interface, as shown by the solid line 26, causing photo electrons to be accelerated toward the buried n-channel.

The ideal metal flash gate contact will be analyzed and then the electric fields generated within the CCD as a function of the contact potential will be calculated. Following that, the flash gate configuration, which includes a native oxide between the CCD and the metal, will be analyzed. But first it should be noted that the metal flash gate may be used to equal advantage to increase the QE of a p-n photodiode shown in FIG. 12b having diffused n+ and p+-regions for the diode contacts. In the case of such a photodiode, the flash gate shown on the thinned p-side may alternatively be on the n-side. In other words, as is also true of the CCD, the n and p-doping can be interchanged.

The Ideal CCD Flash Gate

FIG. 12c, shows the CCD and metal separated at a large distance d with the metal having a larger work function than the CCD. Under these circumstances, the Fermi levels do not coincide and the system is not in equilibrium. When the metal and CCD are moved closer together as shown in FIG. 12d, electrons will tunnel from the CCD to the metal when the physical separation d is on the order of less than 30 Å or about 6 interatomic distances. The flow of electrons creates a negative charge in the metal and an accumulation of holes at the surface of the CCD, as indicated in FIG. 12e. This generates an electric field within the CCD which raises the potential energy of the electrons with respect to the those on the metal until the two Fermi levels coincide, at which point the tunneling current stops. The contact potential which develops after this current flow is simply given by the work function difference between the CCD and metal gate:

$$V_s = -\phi_m + (\chi + V_n) \quad (24)$$

where $V_s$ is the contact potential (or surface potential), $\phi_m$ is the work function of the metal and $(\chi + V_n)$ is the work function of the CCD where $\chi$ is the energy difference the conduction and to the vacuum levels ($\chi = 4.15$ cV for silicon), and $V_n$ is the energy difference between the Fermi level and the conduction band which can be found as a function of $N_A$, by the equation:

$$V_n = \frac{E_g}{2} + kT \ln\left(\frac{N_A}{n_i}\right) \quad (25)$$

where $E_g$ is the bandgap for silicon given by:

$$E_g = 1.1557 - \frac{7.021 \times 10^{-4} T^2}{1100 + T} \quad (26)$$

where T is the temperature (°k), and Ni is the intrinsic carrier concentration given by:

$$n_i = 3.87 \times 10^{16} T^{3/2} \exp(-E_g/2kT) \quad (27)$$

where k is Boltzmann's Constant ($8.62 \times 10^{-5}$ eV/K).

The electric field, $E_A$, generated within the CCD due to the contact potential, $V_s$, can be calculated from the following equations:

$$E_A = \frac{kT \, F(U, U_F)}{L_D} \quad (28)$$

$$F(U, U_F) = [e^{U_F}(e^{-U} + U - 1) + e^{-U_F}(e^U - U - 1)]^{\frac{1}{2}} \quad (29)$$

where U is the normalized potential ($U = V/kT$) in the CCD, $U_f$ is the normalized doping potential ($U_f = -(E_i - E_f)/kT$) where $E_i$ is the intrinsic level of silicon and $E_f$ is the Fermi level for the doped material, and $L_D$ is the intrinsic Debye length given by:

$$L_D = \left(\frac{\epsilon_s kT}{q^2 n_i}\right)^{\frac{1}{2}} \quad (30)$$

The value given by the potential function $F(U,U_f)$ in the CCD at a distance x from the surface is given by the relationship:

$$x = -L_D \int_U^{U_s} \frac{dU'}{F(U', U_F)} \quad (31)$$

and is used to find the electric field as a function of distance from the surface.

Figure 13:
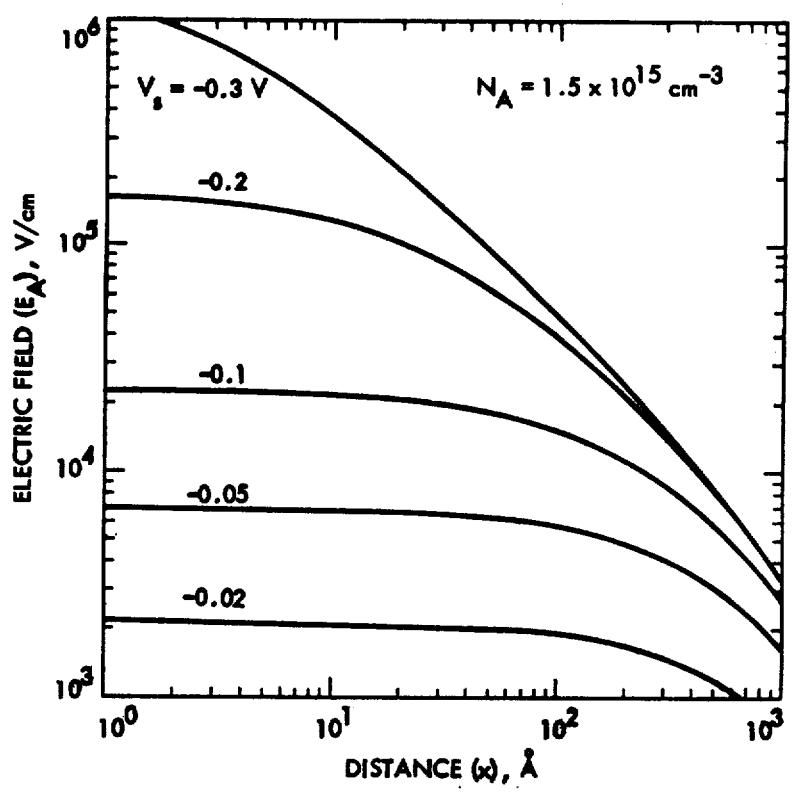
FIG. 13 is a graph of electric field, $E_A$, generated inside the CCD caused by the contact potential, $V_s$, developed between the CCD and the metal gate as a function of distance, x.

FIG. 13 shows the electric field generated within the CCD, based on the equations above for different values of $V_s$ for a doping concentration of $N_A = 1.5 \times 10^{15}$ cm$^{-3}$. Note that small contact potentials generate large electric fields at the backside of the CCD. It can be shown that field strengths of greater than $-10^5$ V/cm are required to keep photo electrons from diffusing to the backside and achieve the QE-pinned condition at all wavelengths of interest (1-10,000 Å). Therefore, contact potentials of greater than $-0.2$ V are required as shown by FIG. 9.

CCD Flash Gate With Interfacial Layer

In practice the full contact potential does not drop entirely within the CCD, but in part develops across a native oxide film which forms at the surface of the CCD after thinning. To understand the effects of an oxide film on the CCD flash gate, the energy band diagrams shown in FIGS. 14a and 14b will now be considered.

Figure 14:
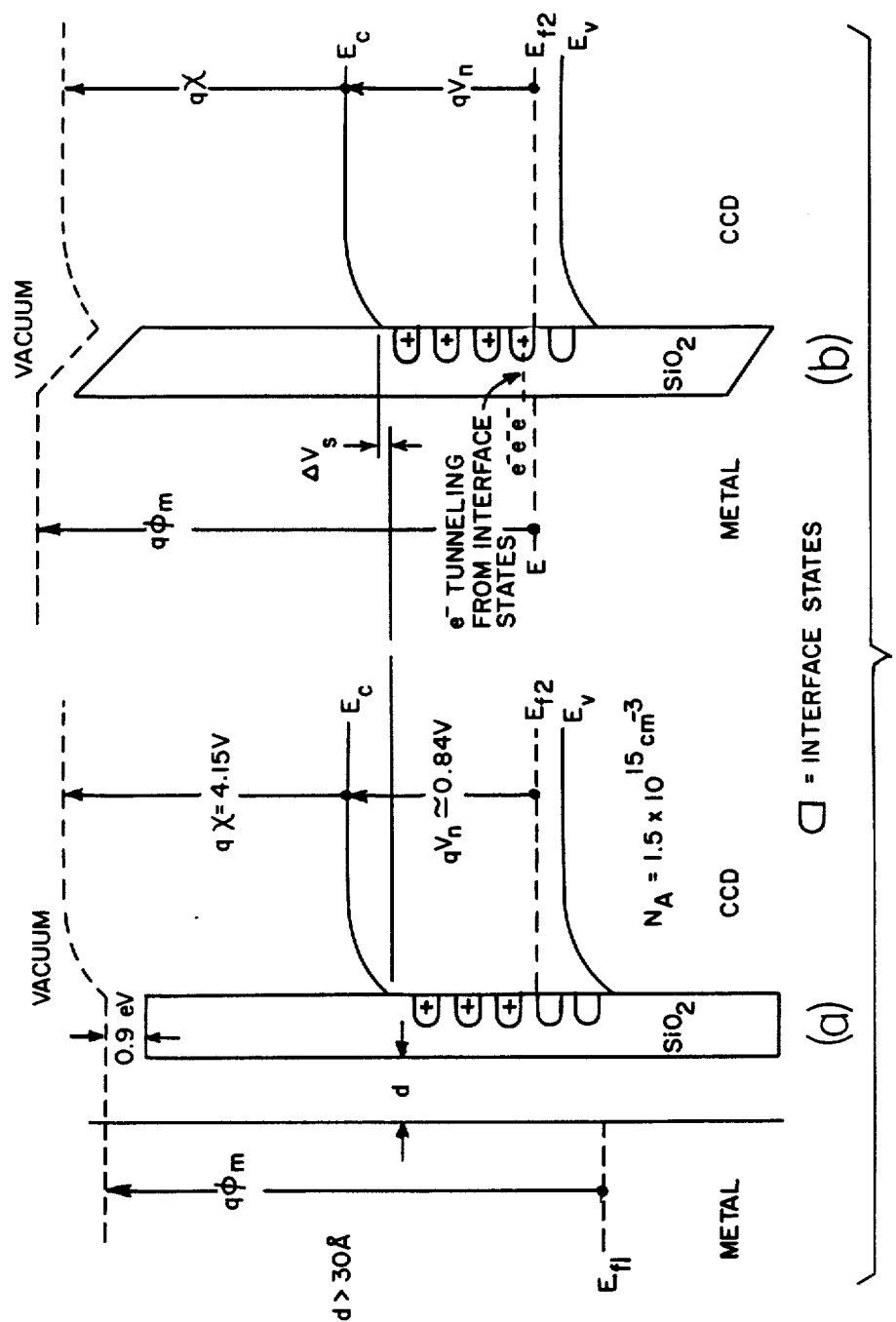
FIGS. 14a and 14b are energy band diagrams illustrating the establishment of equilibrium conditions between a metal flash gate and a CCD with a native oxide as the metal approaches the CCD from a distance d to intimate contact with the native oxide film.

FIG. 14a shows interface states located at the Si-SiO$_2$ interface which are positively charged above the Fermi level (or when empty of electrons) and neutral when below the Fermi level (or when filled with electrons). The positively charged interface states will result in the formation of a surface depletion layer leaving a space charge layer of uncompensated boron ions (i.e., a backside well). The total charge contained within the space charge region is equal in magnitude to the total charge associated with the positive charge in the surface states.

When the metal approaches the CCD to the point where the tunneling probability is high enough, electrons will tunnel from the interface states as opposed to the CCD semiconductor matrial. If the density of interface states is high enough, the states will supply all the charge necessary to set up the contact potential required to align the Fermi levels between the CCD semiconductor and metal as shown in FIG. 14b. The resulting band structure within the CCD is essentially the same as before the metal contact, except that the bands may bend up slightly by $\Delta V_s$ if some electrons are supplied by the CCD semiconductor. In this case, the contact potential that develops between the metal and CCD semiconductor is dropped across the native oxide instead of within the CCD semiconductor and the backside remains in depletion as opposed to accumulation. As will be shown hereinafter, interface states in practice do play a very important role in achieving the QE-pinned condition when using the CCD flash gate. It is therefore important to understand quantitatively the correlation of surface potential as a function of interface density for different flash gate metals.

An expression has been obtained to describe surface potential as a function of interface state density and will be given here. The expression assumes that: (1) the interfacial layer is very thin to allow for tunneling (native oxides are typically less than 16 Å immediately after thinning and grown to 30 Å when fully aged), (2) the surface states are a property of the semiconductor and are independent of the metal (this last assumption is necessary because the interface structure changes with time due to diffusion of the metal into the CCD semiconductor, as will be discussed more fully below, and (3) the interface state density is constant about the Fermi level.

It can be shown with the aid of FIGS. 14a and 14b that the surface potential $V_s$ developed by a metal contact with a p-semiconductor through an interfacial layer varies with surface state density $D_s$ (states/cm$^2$/eV) as:

$$V_s = c_2(E_g + \chi\phi_m) + (1 - c_2)\phi_o - V_p \tag{32}$$

where $$c_2 = \frac{\epsilon_{ox}}{\epsilon_{ox} + qdD_s} \tag{33}$$

and $\phi_o$ is a parameter of the surface energy before contact, and is defined by the equation:

$$\phi_o = V_{so} + V_p \tag{34}$$

where $V_{so}$ is the surface potential (eV) before the metal contact was formed and $V_p$ is the energy difference between the valence and Fermi level within the bulk of the CCD semiconductor given by the equation:

$$V_p = \frac{E_g}{2} - kT \ln\left(\frac{N_A}{n_i}\right) \tag{35}$$

It is important to note the two limiting cases of Equation (32). When the interface density is low such that $C_2 \doteq 1$, the surface potential reduces to the ideal metal to CCD semiconductor contact (i.e., Equation (24)). However, when the number of interface states is large such that $C_2 \doteq 0$, Equation (32) reduces to $V_s = V_{so}$ indicating that the surface potential is independent of the metal work function, resulting in no change in the band bending within the CCD semiconductor material.

It is also important to note from Equation (32) that the surface potential is highly dependent on the position of the Fermi level. When increasing the Fermi level, i.e., increasing $V_p$ given by Equation (35), by reducing the doping concentration, $N_A$, the surface potential given by Equation (32) increased towards accumulation. This can be seen more clearly in FIGS. 15 and 16 which plot surface potential as a function of surface state density for impurity concentrations of $10^{18}$ (p+ for the TI 3PCCD), $10^{15}$ (p for the TI 3PCCD) and $10^{10}$ cm$^{-3}$ (intrinsic silicon) for gold and platinum gates with work functions of 5.2 and 5.6 eV respectively assuming an initial band bending, $V_{so}$, of 0.2 eV. Corresponding Fermi levels using Equation (35) for these concentrations are 0.09, 0.26 and 0.55 eV, respectively. From these plots it is seen that as long as the surface state density is below $10^{13}$ states, the CCD will remain in the desired accumulated state. Unfortunately, interface state density for native oxides range widely depending on the environmental history of the surface. For example, surface states densities have been measured as high as $10^{15}$ states/cm$^2$ for freshly cleaved silicon without oxide and reduced to the level of approximately $10^{13}$ states/cm$^2$ for aged native oxides (surface state densities as low as $10^{10}$ states/cm$^2$ can be achieved for thermally grown oxides). If a surface state density of $3 \times 10^{13}$ states/cm$^2$ (the vertical lines shown in FIGS. 15 and 16) is assumed, the surface potential either results in depletion ($V_s > 0V$) or accumulation, ($V_s < 0V$) depending on the position of the Fermi level at the surface.

Figure 15:
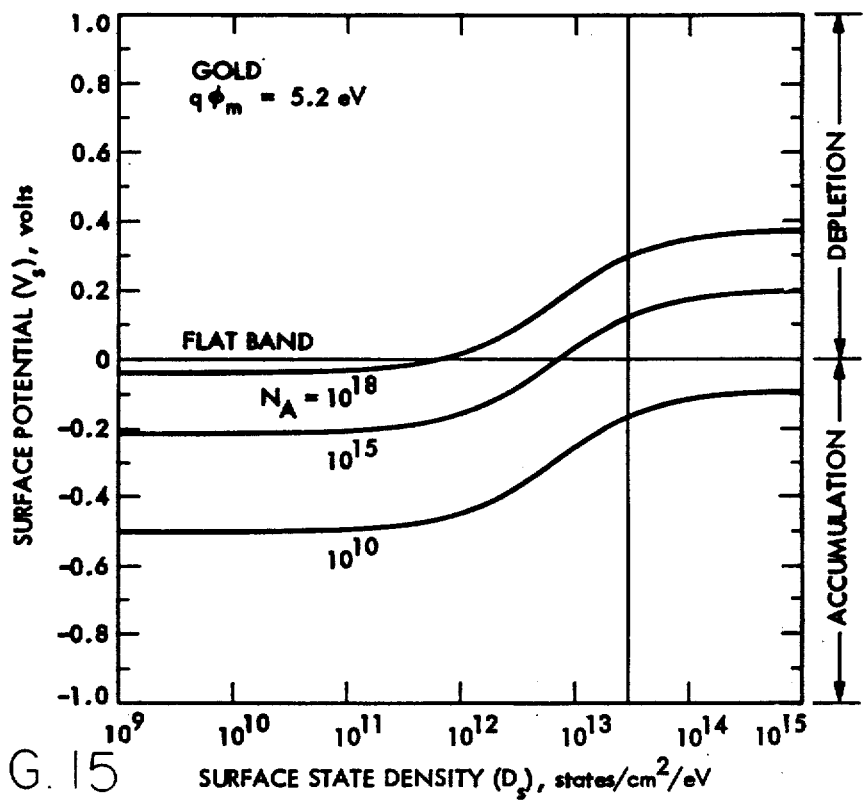
FIG. 15 is a graph of surface potential using a gold gate as a function of surface state density for different doping concentrations. Note that the CCD will remain in the accumulation state as long as the surface state density remains below $10^{13}$ state/cm$^2$-ev for $N_A = 10^{15}$ cm$^{-3}$.
Figure 16:
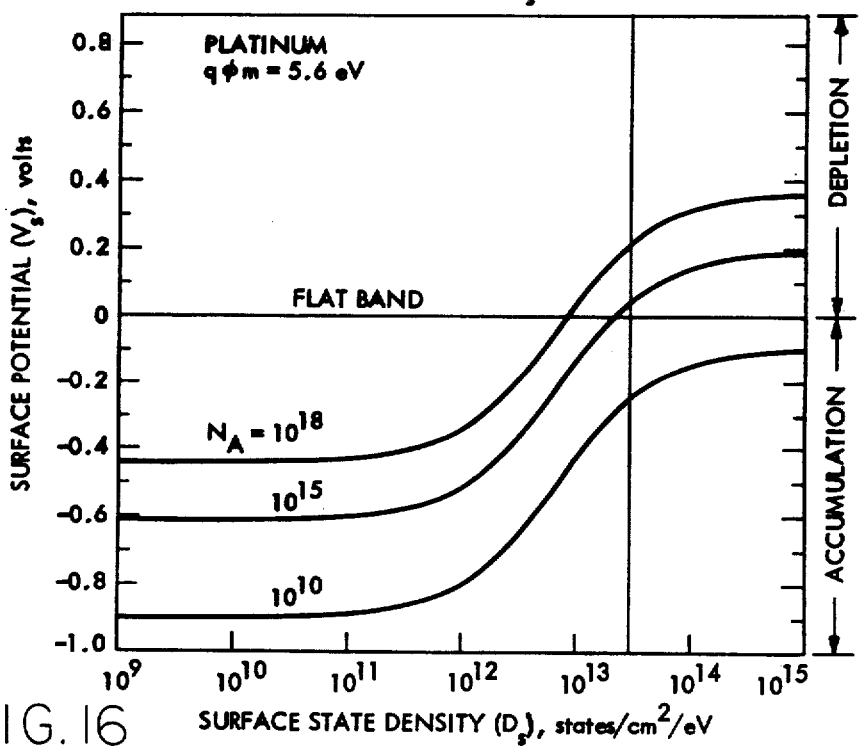
FIG. 16 is a graph the same as in FIG. 15, but using platinum for the flash gate. Note that an extra margin is achieved when accumulating with platinum because of its higher work function.

The Fermi level can either be controlled by doping concentration (as discussed above) or can be controlled by the external voltages to the CCD (as discussed hereinbefore under the subheading "Depletion edge control") by moving the frontside depletion edge to the backside through the substrate voltage $V_{sub}$. Therefore, it is important to remember that the curves shown in FIGS. 15 and 16 can also describe the behavior of the surface potential as the backside is depleted through $V_{sub}$. For example, as the frontside depletion edge moves to the backside through $V_{sub}$, the initial band bending, $V_{so}$, decreases and the Fermi level, $V_p$, increases. Both these factors work in the same direction in pushing the surface potential towards accumulation. FIGS. 15 and 16 will be referred to hereinafter in explaining experimental observations.

Figure 17:
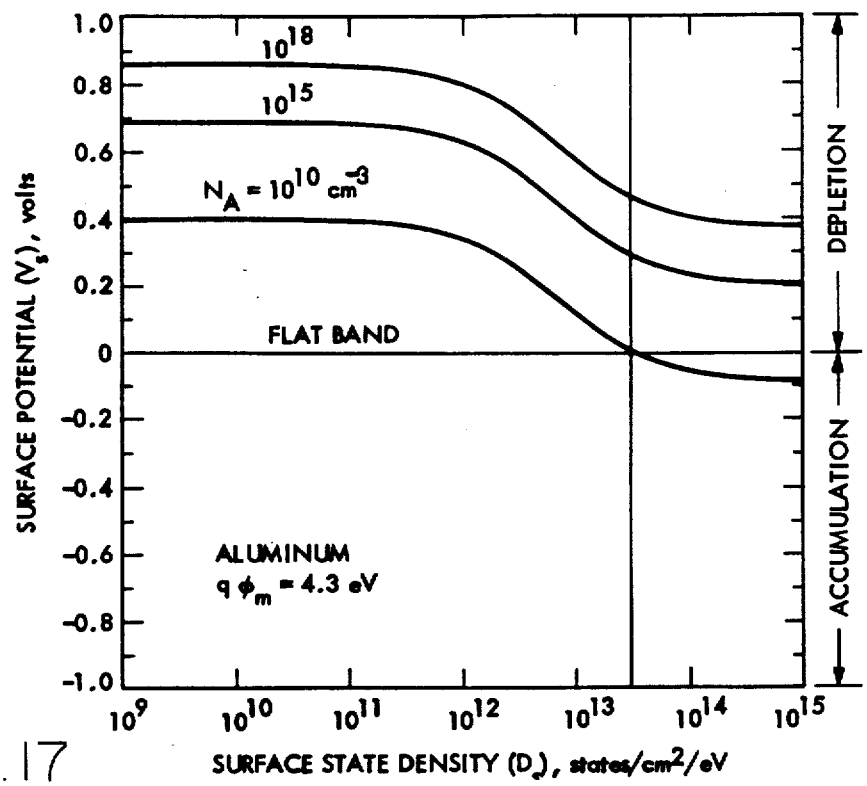
FIG. 17 is a graph the same as in FIGS. 15 and 16, but using aluminum for the flash gate. Note that due to the lower work function of aluminum as compared to the CCD semiconductor material, depletion is promoted as opposed to accumulation.

FIG. 17 shows the effect of aluminum on surface potential which has a work function of approximately 4.3 eV which is (significantly less than the work function of the CCD). Instead of coming from the CCD, electrons will flow from the aluminum gate into the surface states of CCD causing a positive contact potential promoting additional depletion at the surface. Therefore, aluminum is obviously the wrong choice to incorporate as a CCD flash gate. Most work functions for the metals are below the work function of the p-silicon. Experimental results for several metals with the highest work functions will now be presented.

Experimental Results

The CCD flash gate was a result of attempts to make an insulated gate on the backside of the CCD. The original intention was to devise a structure by which the surface potential at the backside of the CCD could be controlled by an external voltage source in producing the QE-pinned condition. To accomplish this, the CCD was first coated on the backside with a $MgF_2$ layer of about 1000 Å thickness by thermal evaporation. On top of this dielectric layer, a thin ($\sim$100 Å) gold film was applied on a small backside area of the CCD. The thickness of the metal gate was chosen by measuring gold films deposited on glass slides for both optical transparency and electrical conductivity. It was found from these slides that while thinner is optically better, there is a minimum thickness of about 20 Å below which the gold films are not conductive. After deposition, the gold gate was bonded out to a backside gate voltage, $V_{bg}$. Increasing $V_{bg}$ positively caused the QE to drop, due to the increase in the backside depletion depth. However, when $V_{bg}$ was biased negatively, the CCD immediately saturated due to minority carrier (electrons) leakage through the $MgF_2$ layer. It is suspected that pinholes and impurities in the $MgF_2$ caused the large leakage of this dielectric layer. At this point, it was realized that the insulation requirements through the dielectric layer of the backside gate are extremely critical and acceptable leakage currents must be on the order of the normal CCD dark current ($<0.01$ e$-$/sec/pixel at $-100°$ C.).

Fortunately, the flash gate presents an alternative means of controlling the CCD backside surface potential. In comparing the QE of the backside gate region to that of surrounding areas, it was noticed that the gate significantly enhanced the QE even when grounded ($V_{bg}=OV$). This observation provided the impetus for applying the first CCD flash gate, without an insulating layer. A variety of gate materials and deposition techniques were used in investigating the flash gate. Three vapor deposition techniques were employed and will briefly be described here.

Direct collision sputtering involves the creation of an ion plasma which releases metal atoms from a target by collision. This method is convenient for coating delicate specimens like the CCD due to the omnidirectional scattering of material which results in uniform films with a stationary sample. For producing a flash gate, a large negative potential ($\simeq$3000 V) is applied to the target (gold or platinum) and an inert gas introduced into the evacuated chamber produces a plasma which is contained by a magnetic field. The ionized gas molecules collide with atoms of the metal target, releasing them. The metal atoms are then attracted to the backside of the CCD, which acts as the anode, thus coating the back surface.

Another technique that may be used is electron beam evaporation. It is more versatile and allows faster deposition rates, but does require rotation of the specimen to assure uniform coverage due to the smaller sources generally used. In this method, a boule of target material is heated by an electron beam at high energy densities releasing atoms by evaporation. The result is deposition of relatively low energy atoms on the backside of the CCD, but possible radiation damage to the CCD from X-rays produced at the target can result. Deposition chamber configuration seems to determine the extent of damage. Generation of high potentials due to stray electrons reaching the substrate is also a problem. If the substrate is kept floating with respect to ground or at the filament potential, this can be avoided, but another problem, bombardment with positive ions, results.

Considering these difficulties, magnetron sputtering would seem to be the best choice for depositing flash gates. However, the high kinetic energy of the sputtered atoms may cause damage to the silicon surface as in e-beam evaporation. To test this, a CCD was vacuum coated with platinum for comparison by thermal evaporation using simple resistance heating. In this method, a tungsten filament is wetted with Pt by wrapping it with a fine platinum wire and applying a large DC current across the filament at low voltage. The current is then increased to evaporate Pt from the filament onto the stationary CCD. While thickness control is not as precise, this technique is very gentle to the CCD because there are no high energy particles involved, although the risk of heating the CCD by radiation from the hot filament is present.

In all cases, coatings were deposited on the CCD back surface after cleaning, by rinsing with methanol and air drying. Owing to the fragile nature of the thinned CCD, no other cleaning, such as ultrasonic or nitrogen stream, was attempted. Some devices had previously been coated with the organic phosphor Coroene to enhance UV response. This coating was removed with Trichloroethane before cleaning, so that only the 20-30 Å native oxide remained. Machined aluminum masks were constructed which fit securely into the CCD package, close to the surface, and could be rotated to expose different areas on the array. The frontside of the devices was shielded with aluminum foil to prevent any metal from depositing on the front contact paths. All coatings were done with the CCD at room temperature.

Four metals were chosen for deposition as flash gates; Pt, Au and Ni, all of which have higher work functions than that of p-silicon, and aluminum in order to observe the effect of a metal gate with lower work function as a test of theory. Experiments have confirmed that platinum, gold and nickel are good candidates for the CCD flash gate.

It appears that gold is too mobile in silicon, and vice-versa, to be practical unless the device is kept at room temperature after deposition. Platinum is less mobile, but still shows evidence of diffusion at higher temperatures. While platinum appears to be the best choice for the current CCDs, due to its high work function and relative stability, it may be possible to use nickel on high resistivity devices. The ability to produce full depletion at the backside should lower the metal work function required to pull up the QE. This would improve long term stability, since nickel diffuses very slowly, if at all, at or below room temperature.

Figure 18:
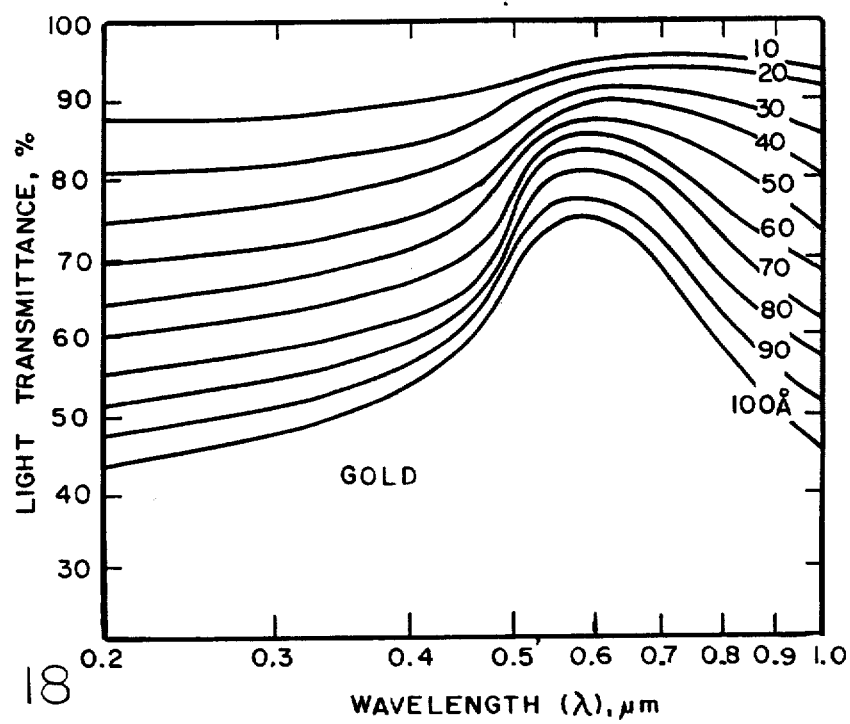
FIG. 18 is a graph of the light transmittance of a gold film as a function of wavelength for thickness from 10 to 100 Å. Note that for less than 10 Å there is negligible absorption across the UV, visible, and near-infrared regions of the spectrum.

For the CCD flash gate, the metal films may be so thin that their effect on optical properties of the surface is negligible since sheet conductivity is not required because no bias is applied. Experimental thickness of the metal films was determined in the same way as for the backside gate, i.e., by depositing films on glass prior to the CCD. Verification of thickness for very thin films (<1 monolayer) was done in a relative manner by comparing different thicknesses on the same CCD using 10,000 Å light where transmission is poor for most metals. FIG. 18 shows the transmission of various gold film thicknesses as a function of wavelength. Similar transmission characteristics are found for nickel and platinum. As can be seen, negligible absorption occurs for flash gate thicknesses less than 10 Å ($\approx$2 monolayers).

A preliminary test of the use of anti-reflection coatings to decrease reflection loss from the back surface has been done. A two-layer coating of $TiO_2$ (910 Å) and $Al_2O_3$ (550 Å) was applied to a flash gate on the back of a CCD. The coatings effectively increased QE of this device.

EXAMPLE

Figure 19A:
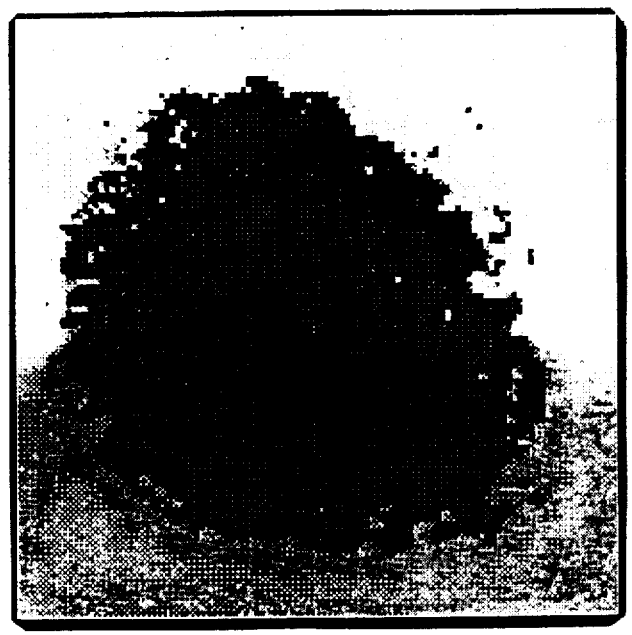
FIG. 19a is a CRT display of a 4000 Å flat field image from a CCD having overthinned corners and outer regions and a 50 Å gold flash gate deposited on only the upper region. The dark central region marks the boundary of the frontside depletion edge where the QE switches to the QE-pinned condition in the corners and outer regions.
Figure 19B:
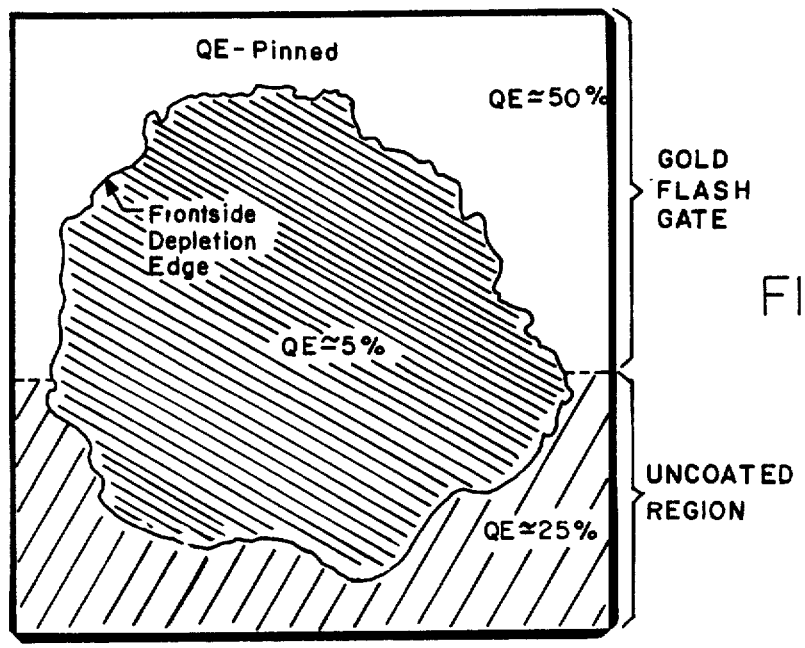
FIG. 19b is a graph in which the frontside depletion edge clearly seen in FIG. 19a is drawn and labeled.
Figure 20:
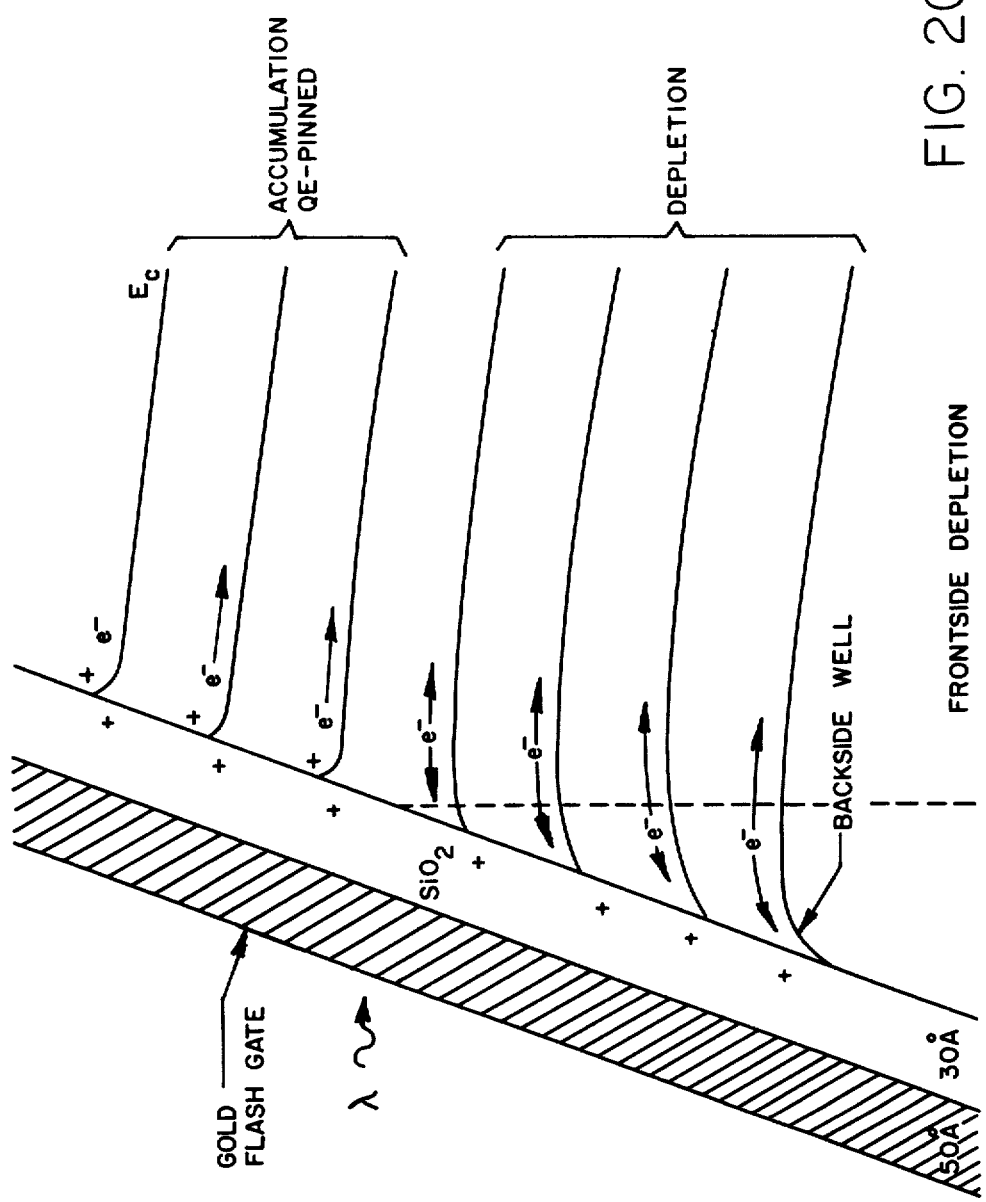
FIG. 20 is a graph showing the energy band structure at the back of the CCD where the frontside depletion edge meets the backside causing the bands to switch from depletion to accumulation.

The 4000 Å flat field image shown in FIGS. 19a and 19b shows the sensitivity (QE efficiency) of the first CCD to utilize the flash gate. The particular CCD for this experiment was purposely chosen because the corners and outer regions were overly thinned to the point where the frontside depletion edge reaches the backside under nominal bias conditions (i.e., $V_{sub}=0$, $V_{fg}=10$ V, $V_{np}=30$ V). The upper half of the CCD was coated with a 50 Å gold flash gate and the lower half was masked and left untreated. The frontside depletion edge can be clearly seen in FIG. 19a and is graphically drawn and labeled in FIG. 19b. Within the overlay region, the flash gate produces the QE-pinned condition. No significant change in QE is observed for the center region after the flash gate was applied. The sudden change in QE at the frontside depletion edge is attributed to where the Fermi level at the backside rapidly increases due to depletion which, as discussed with reference to FIG. 15, reduces the initial band bending (i.e., $V_{so}$) and effectively increases the work function difference between the gate and CCD causing the surface potential to increase towards accumulation. For a given surface state density (say $3 \times 10^{13}$ states/cm$^2$/eV), the surface potential can dramatically "switch" from depletion to accumulation as calculated in FIG. 15 and graphically illustrated in FIG. 20 when the frontside depletion edge approaches the backside over a thickness change of a Debye length.

It is well known that gold diffuses into silicon (and vice-versa) at room temperature. Therefore, a change in sensitivity may occur attributable to a change in structure at the backside due to this diffusion process. It is believed that the gold either diffuses to the Si-SiO$_2$ interface, reducing the number of interface states (by tying up dangling bonds found there), or destroys the 30 Å native oxide altogether. In the event that the number of interface states are reduced, the surface potential will increase (cf., FIG. 15) towards accumulation, increasing the QE within the center area.

It is clear from the experimental results that the flash gate provides a means of achieving permanent accumulation at the backside of the CCD, resulting in increased QE, possibly to the pinned condition, and the elimination of QEH. This makes the flash gate preferable to backside charging with ultraviolet flood illumination, a technique disclosed in the aforesaid copending application, which is a transient effect. It is also clear, however, that the flash gate will only achieve maximum effectiveness under certain conditions. These conditions are as follows:

1. The oxide upon which the gate is deposited must be relatively free of damage. While it is certain that the Si-SiO$_2$ interface states play a major role in determining the QE, the origin and number of these states, and the effect of metal or other diffusing species on them, is not clear. Theory indicates that a smaller number of interface states is beneficial because it minimizes the 'natural' band bending at the surface ($V_{so}$ in Equation (34)), which the gate must overcome for accumulation. It has been observed that the flash gates are most effective on devises with well aged native oxides, and that any disturbance of the interface, such as damage from high energy particles during deposition processes, will affect flash gate performance.

2. In order for the flash gate to be able to bend the bands up at the surface, the depletion of the p-silicon from the frontside must be complete. The advantages of depletion are twofold in that it effectively reduces the work function of the p-silicon and also reduces the number of empty, positive surface states. The devices may be thinned from the backside to approximately reach the depletion region, at which point the substrate voltage can be varied to extend the depletion edge farther. Thinning is a difficult process to properly control because the optimal thickness is only a few microns and must be fairly precise. With the present state of the art in thinning, full depletion can be reached only in some areas of the CCD array. However, final adjustment for full depletion can be made by adjusting the substrate voltage.

In order to make the depletion condition easier to achieve, a higher resistivity p-region should be used in the CCD. This would allow the fields to extend deeper so that the device would not need to be so thin. The extra thickness is desirable not only for thinning constraints, but also results in higher QE for IR and high energy x-ray wavelengths which pass through a thin device. Regions of heavier doping at the backside which are commonly created by ion-implantation or diffusion are not recommended, and not necessary, for the flash gate CCD. A CCD of the type described above, with 15 microns of 100 Ohm p-silicon, has been tested. As expected, the depletion edge can readily be brought to the backside by voltage control after thinning. This was the first CCD in which the desired depletion condition was achieved in all areas of a CCD with a flash gate.

Although particular embodiments of the invention have been described and illustrated herein, it is recognized that modifications and variations may readily occur to those skilled in the art. For example, although a native oxide film of 30 Å thickness has been referred to as the insulating film between the metal flash gate and the backside of the semiconductor device, it is recognized that it takes too long to grow a native oxide film of that thickness after thinning. What is important about the oxide film, aside from its thickness, is that it be relatively free of damage, with few surface states ($<10^{13}$ states/cm$^2$) like aged native oxide. One skilled in the art may be able to grow such a quality oxide film more quickly by chemical treatment of the semiconductor surface, such as with diluted nitric acid (10% HNO$_3$, 90% distilled water) for two minutes, followed by a wash to remove all traces of the acid, and then thoroughly air drying the oxide surface. Consequently, it is intended that the claims be interpreted to cover such modifications and variations.

What is claimed is:

1. A method of producing a semiconductor device for sensing light, said device having a junction between p-doped and n-doped layers of semiconductor material, and two ohmic contacts, one contact to said p-doped layer and one contact to said n-doped layer, said device being adapted to receive light through a surface of a predetermined layer and deliver photogenerated minority carriers through said junction for collection, a technique for improving quantum efficiency by providing for the depletion edge from said junction to extent to said surface of said predetermined layer, and using a metal having a larger work function than said semiconductor material, providing a metal film over said surface of said predetermined layer with a thin oxide film between said metal film and said surface of said predetermined layer, whereby the energy bands, which normally decreases near said surface of said predetermined layer to produce a trap for minority carriers, is caused to instead increase causing minority carriers to be accelerated toward the other layer of said semiconductor material.

2. A method as defined in claim 1 wherein the step of providing for said depletion edge to extend to the surface of said predetermined layer is comprised of thinning said predetermined layer to less than six microns.

3. A method as defined in claim 1 wherein the step of providing for said depletion edge to extend to said surface of said predetermined layer includes applying a bias voltage to said metal film.

4. A method as defined in claim 1 wherein the step of providing for said depletion edge to extend to said surface of said predetermined layer is achieved by thinning said semiconductor device to place said depletion edge near the surface of said predetermined layer, applying a bias voltage to said metal film, and adjusting said bias voltage to control said depletion edge to be at said surface of said predetermined layer.

5. A method as defined in claim 1 wherein said step of providing said thin oxide film consists of growing a quality oxide film.

6. A method as defined in claim 5 wherein said oxide film is native oxide grown to about 30 Å by aging.

7. A method as defined in claim 5 where said oxide film is grown by treatment with nitric acid to 30 Å.

8. A method as defined in claim 5 wherein said quality oxide film is provided with an interface state density level below approximately $3\times10^{13}$ states/cm$^2$—ev.

9. A method as defined in claim 1 wherein said predetermined layer is provided with a doping level less than about $10^{15}$ cm$^{-3}$.

10. A method as defined in claim 1 wherein said predetermined layer is provided with a doping level in the order of $10^{15}$ cm$^-$, and said quality oxide film is provided with an interface state density level below approximately $3\times10^{13}$ states/cm$^2$—ev.

* * * * *